United States Patent [19]

Hansen, Jr.

[11] Patent Number: 4,962,321

[45] Date of Patent: Oct. 9, 1990

[54] THREE TERMINAL REPLACEMENT FOR UNIJUNCTION TRANSISTOR

[75] Inventor: Charles M. Hansen, Jr., Tinton Falls, N.J.

[73] Assignee: Allied-Signal Inc., Morris Township, Morris County, N.J.

[21] Appl. No.: 349,745

[22] Filed: May 10, 1989

[51] Int. Cl.⁵ .................. H03K 3/313; H03K 3/351; H03K 17/30; H03K 17/60
[52] U.S. Cl. .................. 307/301; 307/254; 307/359; 307/636
[58] Field of Search ............... 307/254, 283, 322, 359, 307/301, 636, 253; 331/108 R, 108 C, 111, 115, 132, 143

[56] References Cited

U.S. PATENT DOCUMENTS 3,296,556  1/1967  Schaefer ........................... 307/301
3,621,300  11/1971 Clark ............................... 307/301

FOREIGN PATENT DOCUMENTS 0080910  4/1986  Japan ............................ 307/359

Primary Examiner—John Zazworsky
Attorney, Agent, or Firm—Glen M. Diehl

[57] ABSTRACT

A three terminal replacement circuit for a Unijunction Transistor. The circuit simulates the characteristics and parameters of any UJT with appropriate selection of components. The circuit includes a first node having a voltage in accordance with a biasing circuit, a current conducting circuit for relating the voltage at the first node to a voltage at a second node and for conducting current from a terminal B2 to a terminal B1 through the second node in accordance with a resistor provided in that path, a first switching circuit which turns on when a voltage at a terminal E exceeds the voltage at the second node and a second switching circuit which turns on when the first switching circuit faces. The second switching circuit allows current to flow from the terminal E to the terminal B1 when turned on and changes the biasing circuit to lower the voltages at the first node, the second node and the terminal E.

11 Claims, 3 Drawing Sheets

THREE TERMINAL REPLACEMENT FOR UNIJUNCTION TRANSISTOR

BACKGROUND OF THE INVENTION

This invention relates to a unijunction transistor (UJT). More specifically, it relates to a replacement circuit for a UJT.

A UJT is a three-terminal semiconductor device having electrical characteristics and, therefore, functional applications which are very different from those of conventional two-junction transistors. The features of the UJT most useful to circuit designers are a negative-resistance characteristic over a region of operation, a stable firing voltage, a low firing current, and a high pulse-current capability. Resulting from these characteristics, the UJT finds applications in oscillators, timing circuits, voltage sensing circuits, SCR firing circuits and bistable circuits.

In the semiconductor industry, the demand for UJTs has fallen dramatically as a result of the availability of newer components, for example, the 555 timer. In response, the manufacturers of these devices have either discontinued their products or, in making their products, switched from handmade fabrication techniques to more effective semiconductor fabrication techniques, such as diffusion methods.

As a result, a recently fabricated UJT does not always meet its original performance specifications. Specifically, currently available UJTs exhibit wide variations in their peak-point, leakage current and maximum oscillation frequency characteristics.

This presents a problem in the use of a UJT in an electronic circuit design which relies on the originally specified performance of the UJT. To obtain an operational UJT that will support such circuits, engineers have had to resort to performing special device screening tests on every UJT received, wherein each UJT is tested to ensure compliance with performance specifications. A typical yield from the screenings has been 10 percent, a very low yield. The engineering and manufacturing costs associated with the further use of these components in accordance with their original specifications are, therefore, increasing.

A replacement circuit having the original performance characteristics of a UJT, therefore, is needed.

SUMMARY OF THE INVENTION

The present invention provides a circuit which is a direct pin for pin replacement for a UJT. It therefore has three terminals, including a base-one terminal, a base-two terminal and an emitter terminal. A biasing circuit, connected to a first node in the circuit and the base-one and base-two terminals for biasing the first node, is provided. Current conducting means, connected to the base-two terminal, the first node and a second node for allowing current flow from the base-two terminal to the base-one terminal through the second node in accordance with a resistor connected between the second node and the base-one terminal, are provided. Further, the current conducting means relates the voltage at the first node to the voltage at the second node by a fixed voltage drop.

The circuit also includes a first and second switching means. The first switching means is connected to the base-two terminal, the second node and the emitter terminal. It conducts current from the base-two terminal to the second node when enabled by a voltage at the emitter terminal in relation to the voltage at the second node.

The second switching means is connected to the base-one terminal, the emitter terminal, the biasing means and the first switching means. The second switching means conducts current from the emitter terminal to the base-one terminal when enabled. Further, it causes the biasing means to bias the first node at a first pre-determined voltage when not enabled and at a second pre-determined voltage, which is lower than the first pre-determined voltage, when enabled. The second switching means is enabled by enablement of the first switching means.

The circuit of the present invention permits simulation of any UJT by appropriate selection of components. Any desired performance parameter is, therefore, achievable. Furthermore, the invention can easily be implemented in presently available hybrid or monolithic circuit technology to provide a package compatible with standard UJT outlines.

DESCRIPTION OF THE PREFERRED EMBODIMENT

Figure 1:
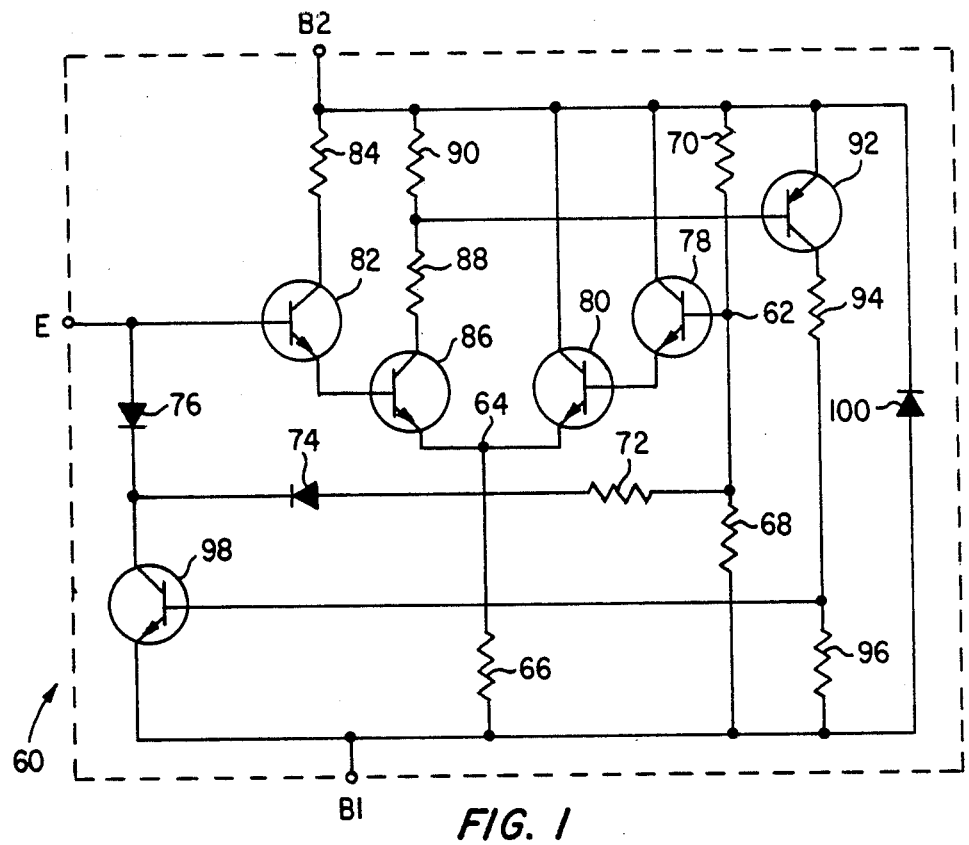
FIG. 1 illustrates a UJT replacement circuit in accordance with a preferred embodiment of the present invention.

FIG. 1 illustrates a schematic of a UJT replacement circuit in accordance with a preferred embodiment of the present invention. Since all of the parameters of a UJT can be selectively determined by the appropriate choice of components or by additional components, the illustrated circuit is a direct three-pin replacement for any UJT. Furthermore, the circuit has very low current requirements.

Figure 2:
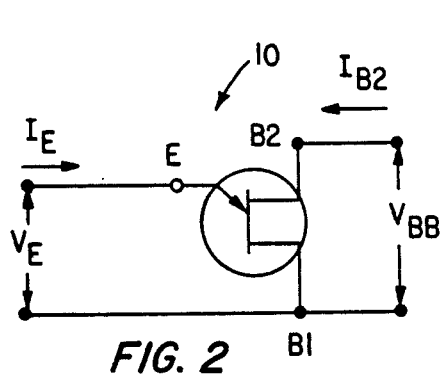
FIG. 2 illustrates the schematic symbol of a UJT and identifies the principal voltages and currents therein.
Figure 3:
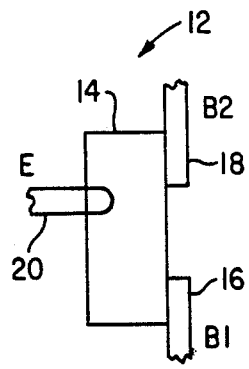
FIG. 3 is a section view of a UJT illustrating the construction thereof.

FIGS. 2 and 3 illustrate the circuit symbol for a UJT and a cross-sectional view of the construction of a UJT, respectively. A UJT 10 is a three terminal device, having a base-one (B1) terminal, a base-two (B2) terminal and an emitter (E) terminal. FIG. 2 identifies the principal voltages and currents associated with a UJT 10. The emitter voltage, $V_E$, is the voltage across the terminals E and B1. The emitter current, $I_E$, is the current into the terminal E. The interbase voltage, $V_{BB}$, is the voltage across the terminals B1 and B2. The base-two current, $I_{B2}$, is the current into terminal B2.

Referring to FIG. 3, a UJT 12 is fabricated from a bar of high-resistivity n-type silicon 14, called the base. Two ohmic contacts 16 and 18, which are the terminals B1 and B2, respectively, are attached to the base 14 at opposite ends. An aluminum wire 20, which is the terminal E, is alloyed to the base 14 to form a p-n rectifying junction.

Figure 4:
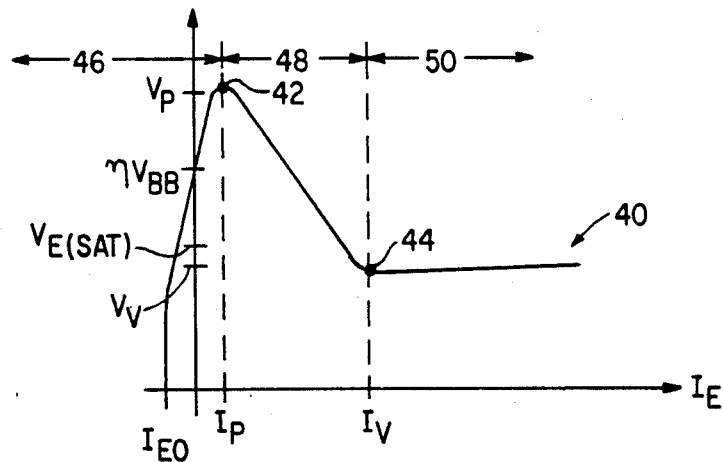
FIG. 4 is a characteristic curve which illustrates the typical performance of a UJT.

The performance of a UJT is typically represented by characteristic curves which plot $V_E$ versus $I_E$ for fixed values of $V_{BB}$. FIG. 4 illustrates a typical characteristic curve 40. There are two points of particular interest, the peak point 42 and the valley point 44. The peak point 42 has associated with it a Peak Point Emitter Voltage, $V_P$, also known as the firing voltage and a Peak Point Current, $I_P$, also known as the firing current. The valley point 44 is similarly associated with a valley voltage, $V_V$, and a valley current, $I_V$.

The characteristic curve 40 defines three regions of operation. The region 46 to the left of the peak point 42 is called the cutoff region. In this region, the terminal E is either reversed biased so that only a small leakage current, $I_{EO}$, flows out or it has a small positive voltage thereon so that a small $I_E$ exists. In the region 48, between the peak point 42 and the valley point 44, a UJT operates with a negative resistance characteristic, one of its important features. To the right of the valley point 44 is the saturation region 50. Here the dynamic resistance is positive, typically in the range of 5–20 ohms, and $V_E$ reaches its saturation voltage, $V_E(\text{sat})$, as indicated in FIG. 4.

Other performance parameters of concern in a UJT include (1) the Interbase Resistance, $R_{BB}$, (2) the Intrinsic Stand-off Ratio, ($\eta$), and (3) the Interbase Modulated Current, $I_{B2}$ (Mod). $R_{BB}$ is the resistance between the terminals B1 and B2. The stand-off ratio is defined by the equation:

$$V_P = (\eta) V_{BB} + V_D$$

where $V_D$ is about 0.67 volts at 25° C. and decreases with temperature at about 3 millivolts/° C. The parameter $I_{B2}$ (mod) indicates the effective current gain between E and B2.

These characteristics and parameters of a UJT are well known in the art. See, for example, *Pulse and Digital Switching Waveforms*, by Millman and Taub, published by McGraw-Hill in 1965, at pages 457–460 and *GE Transistor Manual*, published in 1962, at pages 191–201, which are hereby incorporated by reference.

Referring to FIG. 1, a three-terminal circuit in accordance with a preferred embodiment of the present invention, which is a pin for pin replacement for a UJT, will now be described. The circuit 60 has three terminals, B1, B2 and E, corresponding to the three terminals of a UJT. The circuit 60 includes a first node 62 and a second node 64. A resistor 66 is connected between the second node 64 and the terminal B1. Biasing means are included for determining a voltage at the first node 62. The biasing means preferably includes the resistor 68 connected between the first node 62 and the terminal B1, the resistor 70 connected between the first node 62 and the terminal B2 and the resistor 72 connected between the first node 62 and the terminal E through the diodes 74 and 76.

The diode 74 prevents current flow from the terminal E to the terminal B1 via the resistors 68 and 72 before $V_P$ is reached. The diode 76 prevents current flow from the node 62 to the terminal E at the base of the transistor 82. It also allows control over $I_P$ since the voltage from the node 62 through the diode 74 which appears at the collector of the transistor 98 back biases the diode 76 and prevents variations in $I_P$ due to temperature dependent variations in the collector leakage current of the transistor 98.

Current conducting means are provided for allowing current flow from the terminal B2 to the terminal B1 in accordance with the value of the resistor 66 and for relating a voltage at the first node 62, as determined by the biasing means, to a voltage at the node 64. The current conducting means preferably includes a transistor 78 having a base connected to the first node 62, a collector connected to the terminal B2 and an emitter connected to the base of a transistor 80. The transistor 80 has a collector connected to the terminal B2 and an emitter connected to the second node 64.

The circuit 60 also includes a first switching means for conducting current from the terminal B2 to the second node 64 and then to the terminal B1 through the resistor 66, when enabled by a voltage at the terminal E in relation to the voltage at the second node 64. As illustrated in FIG. 1, the first switching means preferably includes a transistor 82 having a base connected to the terminal E, a collector connected through the series resistor 84 to the terminal B2 and an emitter connected to the base of a transistor 86. The resistor 84 limits the power dissipation in the transistor 82, but can be eliminated if a suitably rated transistor 82 is selected. The transistor 86 has a collector connected through the resistors 88 and 90 to the terminal B2 and an emitter connected to the second node 64.

A second switching means is provided for conducting from the terminal E to the terminal B1 when enabled. The second switching means also causes the biasing means to bias the first node 62 at a first pre-determined voltage when not enabled and at a second pre-determined voltage, which is lower than the first pre-determined voltage, when enabled The second switching means is enabled by enablement of the first switching means. The second switching means preferably includes a transistor 92 having a base connected to the connection between the resistors 88 and 90, an emitter connected to the terminal B2 and a collector connected through the resistors 94 and 96 to the terminal B1. It also includes a transistor 98 having a base connected to the connection between the resistors 94 and 96, an emitter connected to the terminal B1 and a collector connected to the terminal E through the diode 76.

The diode 100 is provided with its anode connected to the terminal B1 and its cathode connected to the terminal B2. The purpose of the diode 100 is to prevent damage if reverse polarity voltage is accidentally connected to the terminals B1 and B2 although the diode 100 is not needed for the circuit 60 to function.

The performance of the circuit 60 will now be explained with reference to the characteristic curve 40 of FIG. 4. For the purposes of this discussion, assume that $V_{BB}$ is greater than 0 volts and that $V_E$ is initially either negative (terminal E reversed biased) or very small. The circuit 60 is, therefore, initially operating in the cutoff region 46 of the characteristic curve 40. The resistor network formed by the resistors 68 and 70 divides $V_{BB}$ so as to bias the first node 62 at a first pre-determined voltage. The transistors 78 and 80 are, therefore, turned on so that a current flows from the terminal B2 to the terminal B1 in accordance with the value of the resistor 66. The appropriate selection of the resistor 66, therefore, permits simulation of a range of $R_{BB}$ characteristics in a UJT.

The voltage at the second node 64 is equal to the voltage at the first node 62 less the voltage drops across the base-emitter junction of the transistors 78 and 80. The voltage at the second node 64 is, therefore, determined by $V_{BB}$ and the values of the resistors 68 and 70. At this time, the transistor 98 is turned off, so that the resistor 72 does not affect the voltage at the first node 62.

Since the voltage at terminal E is either negative or very small and the voltage at the second node 64 is related to $V_{BB}$, the transistors 82 and 86 are turned off. $I_E$ is, therefore, very small, so that during this region of operation the circuit 60 simulates the operation of a UJT in the cutoff region 46.

$I_E$ remains small as $V_E$ is increased, thereby following the characteristic curve 40 in the cutoff region 46. This continues until $V_E$ is increased sufficiently, relative to the voltage at the node 64 to enable the transistors 82 and 86. In FIG. 1, therefore, when $V_E$ is equal to the voltage at the node 62, transistors 82 and 86 will turn on and conduct current from the terminal B2 to the terminal B1.

The first pre-determined voltage at the node 62, therefore, determines $V_P$ for the circuit 60, so that the $V_P$ for any UJT can be simulated by appropriate selection of the resistors 68 and 70. $I_P$ is determined by the leakage current in the transistors 82 and 86 and is advantageously much smaller than found in a typical UJT. $I_P$ can, therefore, be determined by appropriate selection of components.

When the transistor 86 is turned on, the transistor 92 is turned on as a result of the voltage drop across the resistor 90, so that current flows through the resistors 94 and 96. The resulting voltage drop across the resistor 96 turns the transistor 98 on. The resistor 72 is, therefore, placed in parallel with biasing resistor 68, so that the voltage at the node 62 is lowered to a second pre-determined voltage in accordance with the resistance networks formed by the resistors 68, 70 and 72.

The lowering of the voltage at the node 62 also lowers the voltage at the node 64 as well as the emitter voltage required to keep the transistors 82 and 86 turned on, so that $V_E$ decreases. On the other hand, $I_E$ will continue to increase since the transistor 98 provides an additional path for the flow of current from the terminal E to the terminal B1. $V_E$ will, therefore, drop while $I_E$ increases, thereby following the characteristic curve 40 during the negative resistance region 48.

$V_E$ drops until the minimum voltage required to keep the transistors 82 and 86 turned on is reached. This voltage, which corresponds to the voltage, $V_v$, at the valley point 44 on the characteristic curve 40, is determined by the appropriate selection of the resistors 68, 70 and 72 and is related to the second pre-determined voltage at the node 62.

Once $V_E$ falls below $V_v$, the transistors 82 and 86 turn off, causing the transistors 92 and 94 to turn off. This restores the circuit to its pre-fired operating points.

The standoff ratio, $\eta$, in the circuit of FIG. 1, is determined by the ratio of the resistor 70 to the resistor 68. $V_E(\text{sat})$ is determined by the emitter saturation voltage of the transistor 98.

Figure 5:
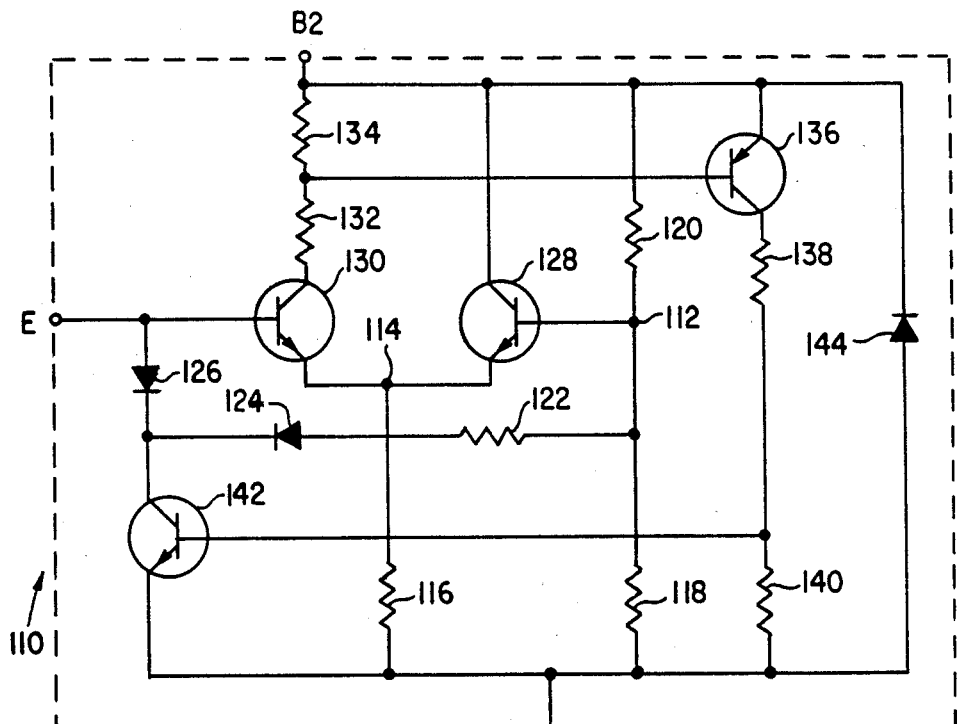
FIG. 5 illustrates a schematic of a UJT replacement circuit in accordance with an alternate embodiment of the present invention.

FIG. 5 illustrates a replacement circuit 110 for a UJT in accordance with an alternate embodiment of the present invention. The circuit includes two nodes 112 and 114 and a resistor 116 connected between the node 114 and the terminal B1 Biasing means for determining the voltage at the node 112, which includes the resistor 118 connected between the node 112 and the terminal B1, the resistor 120 connected between the node 112 and the terminal B2 and the resistor 122 connected between the node 112 and the terminal E through diodes 124 and 126, are provided.

In the alternate embodiment of FIG. 5, the conduction means for allowing current flow from the terminal B2 to the terminal B1 and for relating the voltage at the node 112 to voltage at the node 114 is a single transistor 128. The transistor 128 has a base connected to the node 112, a collector connected to the terminal B2 and an emitter connected to the node 114.

The first switching means for conducting current from the terminal B2 to the node 114 and then to terminal B1 through the resistor 116, when enabled by a voltage at the terminal E in relation to the voltage at the node 114, is similarly a single transistor 130. The transistor 130 has a collector connected through two series resistors 132 and 134 to the terminal B2, a base connected to the terminal E and an emitter connected to the node 114.

The second switching means of the alternate embodiment of FIG. 5 is the same as illustrated in FIG. 1. Specifically, a transistor 136 has a base connected to the connection between the resistors 132 and 134, an emitter connected to the terminal B2 and a collector connected through the series resistors 138 and 140 to the terminal B1. A transistor 142 has a base connected to the connection between the resistors 138 and 140, an emitter connected to the terminal B1 and a collector connected to the terminal E through the diode 126.

The circuit 110 functions in much the same way as already described in relation to FIG. 1. While the circuit 110 has less components than the preferred circuit 60, there is less control over the input impedance and leakage characteristics which are important in defining the peak point parameters.

The above circuits 60 or 110 can be implemented as an analog circuit with discrete components if desired, however, to obtain a direct three-terminal replacement for an UJT, it is preferable to utilize hybrid or monolithic fabrication techniques. Such techniques are well known to one skilled in the art of semiconductor fabrication. In particular, the above circuit is most easily implemented in currently available hybrid circuit technology. However, by replacing large value fixed resistors with small value bias current sources, such as those embodied in the Widlar circuit, see *IEEE Transistor Circuit Theory*, vol. CT-12, pp. 586 to 590, 1965, the circuit can be implemented with monolithic integrated circuit technology.

Figure 6:
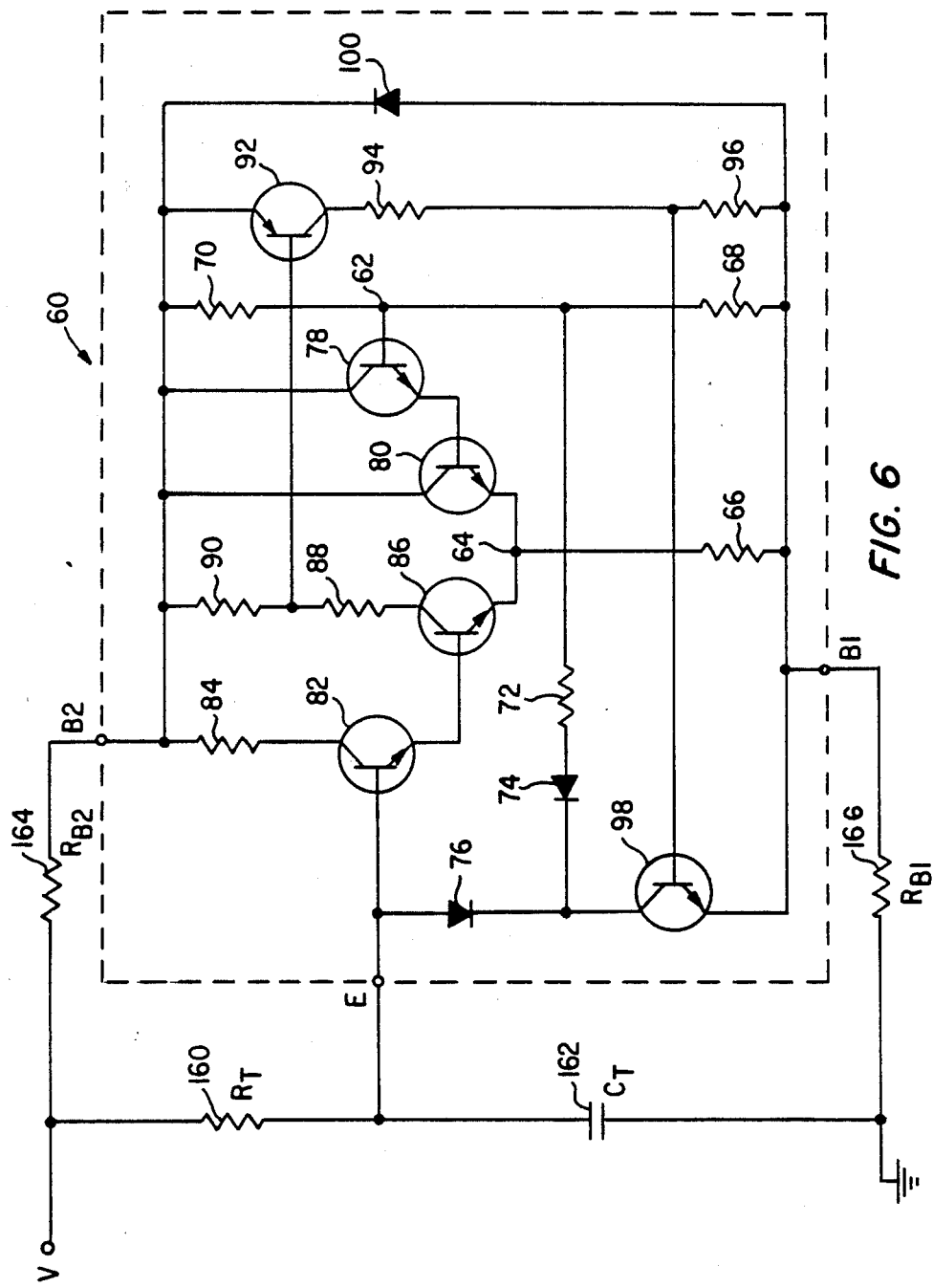
FIG. 6 illustrates an oscillator circuit using the preferred embodiment of the present invention.

Referring to FIG. 6, the use of the preferred embodiment of the present invention as an oscillator, a common UJT application, will now be discussed. The terminal E is connected to a voltage source V through a resistor 160 and to ground through a capacitor 162. The terminal B2 is connected to the voltage source V through a resistor 164 which serves to stabilize the circuit 60 against temperatures variations. The terminal B1 is connected to ground through a load resistor 166 which has a pulse waveform across it when the capacitor 162 discharges.

Initially, the capacitor 162 is being charged by the voltage source V so that in the circuit 60 the transistors 82 and 86 are turned off and the circuit 60 is operating in the cutoff region 46. When the voltage across the capacitor 162 reaches $V_P$, the transistors 82 and 86 will turn on. As discussed before, the transistors 92 and 98 will turn on as a result of transistor 86 being turned on. $I_E$ will therefore increase as the transistor 98 conducts current from the terminal E to the terminal B1 so that the voltage across the capacitor 162 is discharged.

The turning on of the transistors 92 and 98, as discussed previously, causes the voltage at the node 62 and the voltage at the node 64 to shift downward. When $V_E$ decreases to the downshifted voltage relative to the node 62, the transistors 82 and 86 will turn off, causing the transistors 92 and 98 to turn off. This restores the voltage at the node 62 to its pre-fired voltage. Once the transistor 98 turns off, the capacitor 162 will then charge up again through the resistor 160 from the voltage supply V so that oscillation occurs.

The disclosed circuit has an additional advantage over a UJT in the case of the oscillator circuit of FIG. 6. In a conventional UJT, if the resistor 160 is less than 10K ohms, the UJT will typically latch up because the emitter current through the resistor 160 exceeds the valley point current where the negative resistance effect ceases. In this case, oscillation will not be sustained. The valley point in the circuit of FIG. 6, however, is dependent on the voltage at the node 62, not on the current through the transistor 98. As long as the transistor 98 can carry the current resulting from the resistor 160 and the discharge of the capacitor 162 and remain in saturation, the circuit of FIG. 6, therefore, will not latch up.

The use of the replacement circuit in an oscillator configuration, as in FIG. 6, is by way of example only. In this connection it will be understood that if the voltage applied to terminal E (FIG. 6) causing the aforenoted switching is reduced or removed, any application in which any UJT is used can use the replacement circuit of the present invention, since all of the parameters of a UJT can be represented by the replacement circuit.

I claim:

1. A circuit for replacing a UJT, comprising:
   a base-one terminal, a base-two terminal and an emitter terminal;
   a first and a second node each having a voltage associated therewith;
   biasing means connected to said base-one terminal, said base-two terminal and said first node for determining said voltage at said first node;
   a first resistor connected between said second node and said base-one terminal;
   current conducting means connected to said base-two terminal, said first node and said second node for allowing current flow from said base-two terminal to said base-one terminal in accordance with said first resistor and for relating said voltage at said first node to said voltage at said second node by a fixed drop;
   first switching means connected to said base-two terminal, said second node and said emitter terminal for conducting current from said base-two terminal to said second node when enabled by a voltage at said emitter terminal in relation to said voltage at said second node;
   second switching means connected to said base-one terminal, said emitter terminal, said biasing means and said first switching means for conducting current from said emitter terminal to said base-one terminal when enabled and for causing said biasing means to bias said first node at a first pre-determined voltage when not enabled and at a second pre-determined voltage when enabled, said second pre-determined voltage being lower than said first pre-determined voltage, said second switching means being enabled by enablement of said first switching means;
   said current conducting means including a first transistor having a base connected to said first node, an emitter connected to said second node, and a collector connected to said base-two terminal;
   said first switching means including a second transistor having a base connected to said emitter terminal, an emitter connected to said second node and a collector connected to said base-two terminal in series with a second and a third resistor;
   said second switching means including a third transistor having an emitter connected to said base-two terminal, a collector connected to said base-one terminal in series with a fourth and a fifth resistor and a base connected to the connection between said second and said third resistors and a fourth transistor having a base connected to the connection between said fourth and said fifth resistors, a collector connected to said emitter terminal and an emitter connected to said base-one terminal;
   said biasing means including a sixth resistor connected between said first node and said base-two terminal, a seventh resistor connected from said first node to said base-one terminal and an eighth resistor connected from said first node to said emitter terminal;
   a first diode in series between said emitter terminal and said collector of said fourth transistor and having an anode connected to said emitter terminal and a cathode connected to said collector of said fourth transistor; and
   a second diode in series between said eighth resistor and said collector of said fourth transistor and having an anode connected to said eighth resistor and a cathode connected to said collector of said fourth transistor.

2. The circuit as claimed in claim 1, wherein the circuit is fabricated as a hybrid device.

3. The circuit as claimed in claim 1, wherein the circuit is fabricated as a monolithic device.

4. The circuit as claimed in claim 1, wherein a Peak Point Emitter Voltage is determined by said first pre-determined voltage and a Valley Voltage is determined by said second pre-determined voltage.

5. The circuit as claimed in claim 1, wherein an Interbase Resistance is determined by the value of said first resistor.

6. The circuit as claimed in claim 1, further comprising a third diode having an anode connected to said base-one terminal and a cathode connected to said base-two terminal.

7. A circuit for replacing a UJT, comprising:
   a base-one terminal, a base-two terminal and an emitter terminal;
   a first and a second node each having a voltage associated therewith;
   biasing means connected to said base-one terminal, said base-two terminal and said first node for determining said voltage at said first node;
   a first resistor connected between said second node and said base-one terminal;
   current conducting means connected to said base-two terminal, said first node and said second node for allowing current flow from said base-two terminal to said base-one terminal in accordance with said first resistor and for relating said voltage at said first node to said voltage at said second node by a fixed drop;
   first switching means connected to said base-two terminal, said second node and said emitter terminal for conducting current from said base-two terminal to said second node when enabled by a voltage at said emitter terminal in relation to said voltage at said second node;

second switching means connected to said base-one terminal, said emitter terminal, said biasing means and said first switching means for conducting current from said emitter terminal to said base-one terminal when enabled and for causing said biasing means to bias said first node at a first pre-determined voltage when not enabled and at a second pre-determined voltage when enabled, said second pre-determined voltage being lower than said first pre-determined voltage, said second switching means being enabled by enablement of said first switching means;

said current conducting means including a first transistor having an emitter connected to said second node, a collector connected to said base-two terminal and a base connected to an emitter of a second transistor, said second transistor having a collector connected to said base-two terminal and a base connected to said first node;

said first switching means including a third transistor having a base connected to said emitter terminal, a collector connected to said base-two terminal through a second resistor and an emitter connected to a base of a fourth transistor, said fourth transistor having an emitter connected to said second node and a collector connected to said base-two terminal through a third and a fourth resistor;

said second switching means including a fifth transistor having an emitter connected to said base-two terminal, a collector connected to said base-one terminal through a fifth and a sixth resistor and a base connected to the connection between said third and fourth resistors and a sixth transistor having a base connected between said fifth and sixth resistors, a collector connected to said emitter terminal and an emitter connected to said base-one terminal; and said biasing means including a seventh resistor connected between said first node and said base-one terminal and a ninth resistor connected between said first node and said emitter terminal.

8. The circuit as claimed in claim 7, further comprising:

a first diode in series between said emitter terminal and said collector of said sixth transistor having an anode connected to said emitter terminal and a cathode connected to said collector of said sixth transistor; and, a second diode in series between said ninth resistor and said collector of said sixth transistor having an anode connected to said ninth resistor and a cathode connected to said collector of said sixth transistor.

9. The circuit as claimed in claim 8, further comprising a third diode having an anode connected to said base-two terminal and a cathode connected to said base-one terminal.

10. The circuit as claimed in claim 8, wherein a stand-off ratio is determined by the ratio of said eighth resistor to said seventh resistor.

11. The circuit as claimed in claim 8, wherein a Peak Point Current is determined by a leakage current in said third and fourth transistors.

* * * * *